United States Patent [19]
Chen et al.

[11] Patent Number: 6,055,743
[45] Date of Patent: May 2, 2000

[54] METHOD AND APPARATUS FOR DRYING SEMICONDUCTOR WAFERS WITHOUT FORMING WATER MARKERS THEREON

[75] Inventors: Yi-Nan Chen, Taipei; Wen-Chi Hsu, Hualien Hsien, both of Taiwan

[73] Assignee: Nanya Technology Corp., Taiwan

[21] Appl. No.: 09/009,158

[22] Filed: Jan. 20, 1998

[30] Foreign Application Priority Data

Nov. 15, 1997 [TW] Taiwan ................................. 86117081

[51] Int. Cl.[7] ...................................................... F26B 3/00
[52] U.S. Cl. ................................................. 34/470; 34/78
[58] Field of Search .............................. 34/350, 357, 468, 34/467, 470, 73, 78, 342; 134/902

[56] References Cited

U.S. PATENT DOCUMENTS 4,090,307   5/1978   Gollmick et al. ......................... 34/342
5,443,540   8/1995   Kamikawa ................................ 34/471

*Primary Examiner*—Pamela A. Wilson
*Attorney, Agent, or Firm*—Michael D. Bednarek; Crowell & Moring LLP

[57] ABSTRACT

A method and an apparatus for drying a semiconductor wafer. The semiconductor wafer is first dipped in a liquid with a volatility higher than water and which is miscible with water. The dipped semiconductor wafer is then delivered in an IPA dryer to carry out the drying process. The drying process includes evaporating isopropyl alcohol to obtain a vapor and condensing the IPA vapor on the surface of the semiconductor wafer. The IPA is heated and vaporized by a hot plate disposed at the bottom of the IPA dryer. The condenser is mounted on the inner peripheral surface of the IPA dryer and surrounds the semiconductor wafer, which is supported by a holder.

18 Claims, 2 Drawing Sheets

```
┌─────────────────────────────┐
│ Dipping a semiconductor     │
│ wafer in a first liquid L₁  │
└─────────────────────────────┘
              │
              ▼
┌─────────────────────────────┐
│ Vaporizing a second liquid  │
│      in a dryer 300         │
└─────────────────────────────┘
              │
              ▼
┌─────────────────────────────┐
│ Condensing the vapor of     │
│ the second liquid ₂ on      │
│ the dipped semiconductor    │
│ wafer in a dryer            │
└─────────────────────────────┘
```

FIG. 2

METHOD AND APPARATUS FOR DRYING SEMICONDUCTOR WAFERS WITHOUT FORMING WATER MARKERS THEREON

BACKGROUND OF THE INVENTION

1. Field of the Invention

The present invention generally relates to a method and an apparatus for drying semiconductor wafers. In particular, it relates to a method and an apparatus for drying semiconductor wafers using an IPA dryer in which the semiconductor wafers are dipped in a liquid IPA prior to drying in an IPA dryer.

2. Description of the Related Art

Recently, IPA dryers have been used for the drying of semiconductor wafer, because compared to a spin dryer, the semiconductor wafers incur less mechanical damage and a cleaner semiconductor wafer surface is obtainable.

A typical IPA dryer is shown in FIG. 1. An IPA dryer 100 is isolated with shutters 201 and 202 to isolate the semiconductor wafers to be dried from oxygen and to reduce the water content contained in the semiconductor wafers. Semiconductor wafers 10, for example which have been washed after a wet etching step, are delivered by a mechanical arm 20 to the IPA dryer 100 for drying. IPA (Isopropyl Alcohol) $L_1$ contained therein is heated by a hot plate 14 to its boiling point to generate IPA vapor $L_2$ in the dryer 100. The semiconductor wafers 10 are supported by a holder 110, and are surrounded by cooling or condensation coils 130 disposed on the inner peripheral surface of the dryer 100. The IPA vapor $L_2$ condenses on the semiconductor wafers 10 5 when rising to the level of the cooling coil 130, and then removes contaminants from the semiconductor wafer 10. The IPA condensate which contains the contaminants then drips from the semiconductor wafer 10 to a collecting tray 120 mounted at the bottom of the dryer 100 and is drained out from an outlet 121. However, if any water from the previous washing step remains on the semiconductor wafer 10 before being delivered in the dryer 100 for drying with the IPA vapor $L_2$, the dried semiconductor 10 has water markers formed on the surface thereof.

SUMMARY OF THE INVENTION

It is therefore an object of the invention to provide a method and an apparatus for drying semiconductor wafers by which no water markers are formed on the dried semiconductor wafers.

The object of the invention is attained by including a dipping step of the semiconductor wafers prior to drying the semiconductor wafer in an IPA dryer. The dipping step uses a liquid with a volatility higher than water which is miscible with water.

Specifically, the method of the invention includes dipping the semiconductor wafer in a first liquid with a volatility higher than water and which is miscible with water, and drying the semiconductor wafers using a second liquid with a volatility higher than water and which is miscible with water. The drying step includes vaporizing the second liquid and condensing the vapor of the second liquid on the semiconductor wafers.

The apparatus of the invention includes a dipping device for dipping semiconductor wafers in a first liquid with a volatility higher than that of water and which is miscible with water, and a drying device for drying the dipped semiconductor wafers using a second liquid with a volatility higher than that of water and which is miscible with water. The drying device includes an evaporator for vaporizing the second liquid, and a condenser for condensing the vapor of the second liquid on the dipped semiconductor wafer.

According to an aspect of the invention, the first liquid and the second liquid are isopropyl alcohol, acetone or ethanol.

According to another aspect of the invention, the water remaining on the semiconductor wafers becomes a mixture of water and the first liquid after being dipped in the first liquid, and the mixture is completely evaporated together with the second liquid when the condensate of the second liquid is condensed thereon, and thus no water markers are formed on the dried semiconductor wafers.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein:

FIG. 2 is a flow chart showing the steps of a preferred embodiment of the method of the invention.

DETAILED DESCRIPTION OF THE PREFERRED EMBODIMENT

Referring to FIG. 2, the method of the invention includes the following steps:

(a) dipping a semiconductor wafer, which has been washed in a previous step, in a first liquid with a volatility higher than that of water and which is miscible with water;

(b) vaporizing a second liquid with a volatility higher than water and which is miscible with water in a dryer; and (c) condensing the vapor of the second liquid on the dipped semiconductor wafer.

The first liquid can be isopropyl alcohol, acetone or ethanol. Isopropyl alcohol is preferred, because it has higher miscibility with water than acetone and ethanol. According to the method of the invention, the semiconductor wafer is dipped in the first liquid at the ambient temperature for 200 to 400 seconds, preferably from 280 to 320 seconds. To avoid any oxidation of the semiconductor wafers, the dipping is preferably conducted in an inert atmosphere, for example in a nitrogen atmosphere. The first liquid is miscible with the water remaining on the semiconductor wafer. Thus when the semiconductor wafer is dipped in the first liquid and taken out, a mixture of water and the first liquid remains on the semiconductor wafer.

The dipped semiconductor wafers are then delivered to a dryer in which the second liquid is vaporized and condensed on the semiconductor wafers. The semiconductor wafers are retained in the dryer for 200 to 400 seconds, preferably 280 to 320 seconds. The second liquid can be isopropyl alcohol, acetone or ethanol. Isopropyl alcohol is preferred. Preferably, the same kind of liquid is used for the first liquid and the second liquid. The contaminants on the semiconductor wafer are removed by the condensate of the second liquid and the mixture is simultaneously vaporized by the vapor of the second liquid and then removed. No water markers form on the semiconductor wafer, because the second liquid also has higher volatility than water and the water previously remaining on the semiconductor wafer has become a mixture of water and the first liquid.

Figure 3:
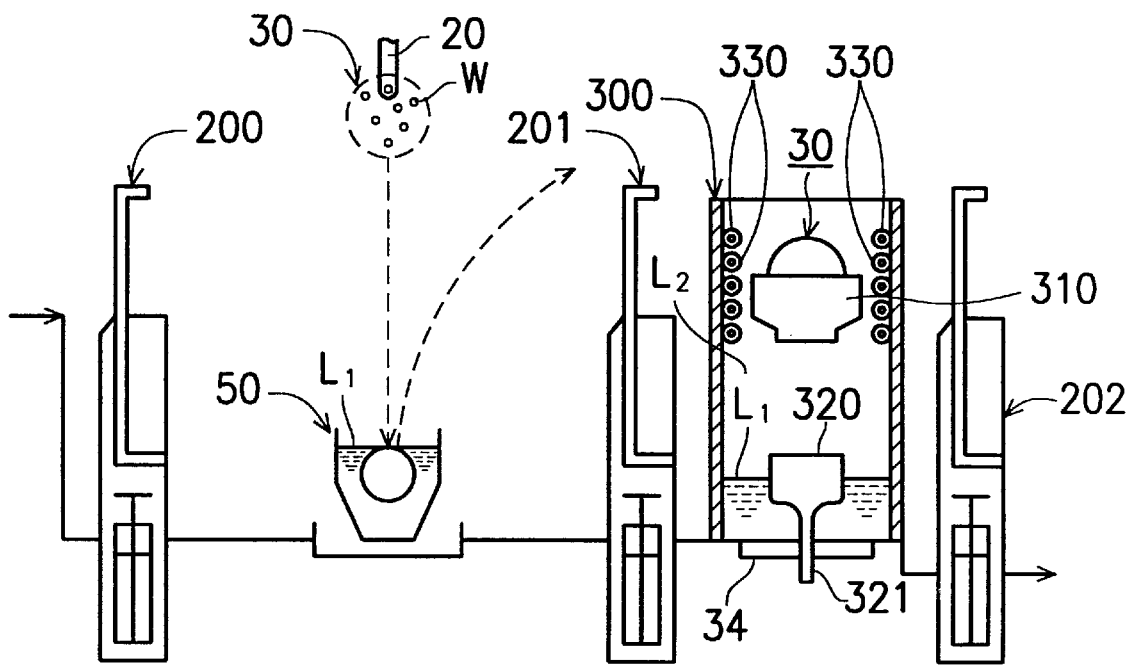
FIG. 3 is a schematic view showing a system for drying semiconductor wafers, which have been previously washed, according to the present invention.

Referring now to FIG. 3, a drying system of a preferred embodiment of the invention is shown. The system uses an IPA dryer 300, however, is additionally provided with a dipping device 50 in which a first liquid $L_1$ is filled. The dipping device 50 is isolated by a shutter 200 and the shutter 201 of the IPA dryer 300. A mechanical arm 20 is provided for delivering a semiconductor wafer 30, which has been washed after a wet etching step, to the dipping device 50 and, after the dipping, delivering the semiconductor wafer to the IPA drier 30.

Figure 1:
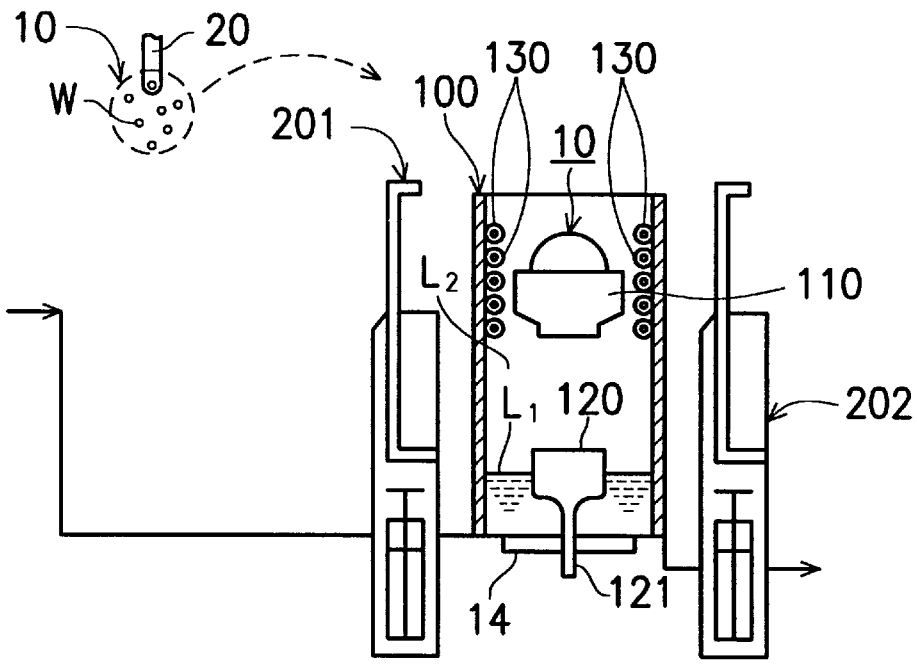
FIG.1 is a schematic view showing an IPA dryer for drying semiconductor wafers, which have been previously washed, according to the prior art.

The structure and function of the IPA dryer 300 used in this preferred embodiment are the same as the IPA dryer 100 in FIG. 1. A holder 310 is provided at the upper position for supporting the dipped semiconductor wafer. The holder 30 is surrounded by cooling or condensation coils 330 disposed on the inner peripheral surface of the dryer 300. A hot plate 34 is provided at the bottom of the dryer 300 for heating the IPA contained therein to its boiling point to generate IPA vapors $L_2$. The IPA vapor $L_2$ condenses on the semiconductor wafers 30 when rising to the level of the cooling coil 330, and then removes contaminants from the semiconductor wafer 30. The IPA condensate containing the contaminants then drips from the semiconductor wafer 30 to a collecting tray 320 mounted at the bottom of the dryer 300 and is drained out from an outlet 321.

What is claimed is:

1. A method of drying a semiconductor wafer previously washed by water, comprising the steps of:

dipping the semiconductor wafer in a first liquid with a volatility higher than water and which is miscible with water;

vaporizing a second liquid with a volatility higher than water and which is miscible with water in a dryer; and condensing the vapor of said second liquid on the dipped semiconductor wafer in the dryer.

2. The method as claimed in claim 1, wherein said first liquid is a liquid selected from the group consisting of isopropyl alcohol, acetone and ethanol.

3. The method as claimed in claim 2, wherein said first liquid is isopropyl alcohol.

4. The method as claimed in claim 1, wherein said second liquid is a liquid selected from the group consisting of isopropyl alcohol, acetone and ethanol.

5. The method as claimed in claim 4, wherein said second liquid is isopropyl alcohol.

6. The method as claimed in claim 1, wherein the semiconductor wafer is dipped in the first liquid for 200 to 400 seconds.

7. The method as claimed in claim 6, wherein the semiconductor wafer is dipped in the first liquid for 280 to 320 seconds.

8. The method as claimed in claim 1, wherein the dipping is performed at ambient temperature.

9. The method as claimed in claim 1, wherein the semiconductor wafer is retained in the dryer for 200 to 400 seconds.

10. The method as claimed in claim 9, wherein the semiconductor wafer is retained in the dryer for 280 to 320 seconds.

11. An apparatus for drying a semiconductor wafer, comprising:

means for dipping the semiconductor wafer in a first liquid with a volatility higher than water and which is miscible with water; and means for drying the dipped semiconductor wafer, having an evaporator for vaporizing a second liquid with a volatility higher than water and which is miscible with water and a condenser for condensing the vapor of said second liquid on the dipped semiconductor wafer.

12. The apparatus as claimed in claim 11, wherein said first liquid is a liquid selected from the group consisting of isopropyl alcohol, acetone and ethanol.

13. The apparatus as claimed in claim 11, wherein said second liquid is a liquid selected from the group consisting of isopropyl alcohol, acetone and ethanol.

14. The apparatus as claimed in claim 11, wherein said first liquid is isopropyl alcohol.

15. The apparatus as claimed in claim 11, wherein said second liquid is isopropyl alcohol.

16. The apparatus as claimed in claim 11, further comprising a holder for holding the semiconductor wafer, wherein said holder is disposed above the evaporator.

17. The apparatus as claimed in claim 16, further comprising a mechanical arm for delivering the dipped semiconductor wafer on said holder.

18. The apparatus as claimed in claim 11, wherein said condenser is mounted surrounding the semiconductor wafer and is a cool coil.

\* \* \* \* \*